(12) United States Patent
Cao et al.

(10) Patent No.: US 9,455,400 B2
(45) Date of Patent: Sep. 27, 2016

(54) MAGNETIC TUNNEL JUNCTION FOR MRAM APPLICATIONS

(71) Applicant: Headway Technologies, Inc., Milpitas, CA (US)

(72) Inventors: Wei Cao, San Jose, CA (US); Cheng T. Horng, San Jose, CA (US); Witold Kula, Gilroy, CA (US); Chyu Jiuh Torng, Pleasanton, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 14/979,949

(22) Filed: Dec. 28, 2015

(65) Prior Publication Data

US 2016/0211442 A1    Jul. 21, 2016

Related U.S. Application Data

(62) Division of application No. 14/315,436, filed on Jun. 26, 2014, now Pat. No. 9,224,940, which is a division of application No. 12/930,877, filed on Jan. 19, 2011, now Pat. No. 8,786,036.

(51) Int. Cl.
*H01L 43/10* (2006.01)
*H01L 43/02* (2006.01)
*H01L 43/08* (2006.01)
*G11C 11/16* (2006.01)

(52) U.S. Cl.
CPC ............ *H01L 43/10* (2013.01); *G11C 11/161* (2013.01); *H01L 43/02* (2013.01); *H01L 43/08* (2013.01)

(58) Field of Classification Search
CPC ...................................................... H01L 43/10
See application file for complete search history.

(56) References Cited

U.S. PATENT DOCUMENTS

| | | | |
|---|---|---|---|
| 7,528,457 B2 | 5/2009 | Horng et al. | |
| 7,595,520 B2 | 9/2009 | Horng et al. | |
| 7,663,131 B2 | 2/2010 | Horng et al. | |
| 7,666,467 B2 | 2/2010 | Parkin | |
| 7,672,093 B2 | 3/2010 | Horng et al. | |
| 7,738,287 B2 | 6/2010 | Diao et al. | |
| 7,750,421 B2 | 7/2010 | Horng et al. | |
| 2006/0180839 A1* | 8/2006 | Fukumoto .............. | B82Y 25/00 257/295 |
| 2008/0088986 A1* | 4/2008 | Horng .................... | B82Y 25/00 360/324.2 |
| 2009/0325319 A1 | 12/2009 | Horng et al. | |

* cited by examiner

*Primary Examiner* — Eugene Lee
(74) *Attorney, Agent, or Firm* — Saile Ackerman LLC; Stephen B. Ackerman

(57) ABSTRACT

A MTJ in an MRAM array is disclosed with a composite free layer having a lower crystalline layer contacting a tunnel barrier and an upper amorphous layer for improved bit switching performance. According to one embodiment, the amorphous layer has a $NiFeM_1/NiFeM_2$ configuration where $M_1$ and $M_2$ are Mg, Hf, Zr, Nb, or Ta, and M1 is unequal to M2. The crystalline layer is Fe, Ni, or FeB with a thickness of at least 6 Angstroms that affords a high magnetoresistive ratio. The $M_1$ and $M_2$ elements in the $NiFeM_1$ and $NiFeM_2$ layers each have a content of 5 to 30 atomic %. The $NiFeM_1/NiFeM_2$ configuration substantially reduces bit line switching current and number of shorted bits. In an alternative embodiment, the crystalline layer may be a Fe/NiFe bilayer. Annealing at 300° C. to 360° C. provides a high magnetoresistive ratio of about 150%.

6 Claims, 3 Drawing Sheets

Sum of ShortAll FF_COL
WAFER FF_ROW
JBB5ZQU
P022-1

| FF_ROW | 2 | 3 | 4 | 5 | 6 | 7 | 8 | 9 | 10 |
|---|---|---|---|---|---|---|---|---|---|
| 3 | – | 1 | 1 | 1 | 0 | 2 | 0 | – | – |
| 4 | 0 | 1 | 0 | 6 | 0 | 2 | 0 | – | – |
| 5 | 0 | 0 | 357 | 0 | 0 | 3 | 0 | 1 | – |
| 6 | 0 | 0 | 5 | 0 | 2 | 1 | 0 | 0 | 0 |
| 7 | 2 | 0 | 0 | 0 | 0 | 0 | 2 | 0 | 1 |
| 8 | 0 | 0 | 2 | 1 | 2 | 0 | 0 | – | 2 |
| 9 | – | 1 | 0 | 1 | 1 | 0 | 3 | 1 | 1 |
| 10 | – | 0 | 0 | 0 | 0 | 1 | 0 | 1 | 0 |
| 11 | – | 0 | 1 | 1 | 2 | 0 | 0 | 0 | – |

FIG. 4a

WAFER FF_ROW FF_COL
SC0GE7U
P010-2

| FF_ROW | 2 | 3 | 4 | 5 | 6 | 7 | 8 | 9 | 10 |
|---|---|---|---|---|---|---|---|---|---|
| 3 | – | – | – | 182 | – | 5 | – | – | – |
| 4 | 4 | – | 65 | – | 199 | 28 | 2 | 9 | – |
| 5 | – | 31 | 40 | 49 | 12 | – | 14 | 6 | – |
| 6 | – | 82 | 21 | 0 | 28 | – | 10 | 9 | 4 |
| 7 | – | 102 | 39 | 18 | 19 | 13 | 8 | 3 | 4 |
| 8 | – | 53 | 25 | 30 | 17 | 22 | – | 8 | 5 |
| 9 | – | 12 | – | 11 | – | – | 11 | 5 | – |
| 10 | – | 16 | 64 | – | – | 19 | 17 | 14 | – |
| 11 | – | – | – | 17 | 6 | 4 | – | – | – |

FIG. 4b Prior Art

MAGNETIC TUNNEL JUNCTION FOR MRAM APPLICATIONS

This is a divisional application of U.S. patent application Ser. No. 14/315,436, filed on Jun. 26, 2014, which is a divisional application of Ser. No. 12/930,877, filed on Jan. 19, 2011, and issued as U.S. Pat. No. 8,786,036, which are herein incorporated by reference in their entirety, and assigned to a common assignee.

RELATED PATENT APPLICATIONS

This application is related to the following: U.S. Pat. No. 7,528,457; U.S. Pat. No. 7,595,520; U.S. Pat. No. 7,663,131; and U.S. Pat. No. 7,672,093; assigned to a common assignee and herein incorporated by reference in their entirety.

FIELD OF THE INVENTION

The invention relates to a high performance Magnetic Tunneling Junction (MTJ) element and a method for making the same, and in particular, to a composite free layer comprised of a crystalline layer that interfaces with a tunnel barrier layer and an amorphous layer contacting an opposite surface of the crystalline layer with respect to the tunnel barrier layer to improve bit switching characteristics while maintaining a high magnetoresistive (MR) ratio.

BACKGROUND OF THE INVENTION

Magnetoresistive Random Access Memory (MRAM), based on the integration of silicon CMOS with MTJ technology, is a major emerging technology that is highly competitive with existing semiconductor memories such as SRAM, DRAM, Flash, etc. A MRAM device is generally comprised of an array of parallel first conductive lines on a horizontal plane, an array of parallel second conductive lines on a second horizontal plane spaced above and formed in a direction perpendicular to the first conductive lines, and an MTJ element interposed between a first conductive line and a second conductive line at each crossover location. A first conductive line may be a word line while a second conductive line is a bit line or vice versa. Alternatively, a first conductive line may be a bottom electrode that is a sectioned line while a second conductive line is a bit line (or word line). There are typically other devices including transistors and diodes below the array of first conductive lines as well as peripheral circuits used to select certain MRAM cells within the MRAM array for read or write operations. A high speed version of MRAM architecture consists of a cell with an access transistor and a MTJ (1T1MTJ) in the array.

A MTJ element may be based on a tunneling magneto-resistance (TMR) effect wherein a stack of layers has a configuration in which two ferromagnetic layers are separated by a thin non-magnetic dielectric layer. In a MRAM device, the MTJ element is formed between a bottom electrode such as a first conductive line and a top electrode which is a second conductive line. A MTJ stack of layers that is subsequently patterned to form a MTJ element may be formed in a so-called bottom spin valve configuration by sequentially depositing a seed layer, an anti-ferromagnetic (AFM) pinning layer, a ferromagnetic "pinned" layer, a thin tunnel barrier layer, a ferromagnetic "free" layer, and a capping layer. In a MRAM MTJ, the free layer has traditionally been made of NiFe because of its reproducible and reliable switching characteristics as demonstrated by a low switching field (Hc) and low switching field uniformity ($\sigma$Hc).

The pinned layer has a magnetic moment that is fixed in the "y" direction, for example, by exchange coupling with the adjacent AFM layer that is also magnetized in the "y" direction. The free layer has a magnetic moment that is either parallel or anti-parallel to the magnetic moment in the pinned layer. The tunnel barrier layer is thin enough that a current through it can be established by quantum mechanical tunneling of conduction electrons. The magnetic moment of the free layer may change in response to external magnetic fields and it is the relative orientation of the magnetic moments between the free and pinned layers that determines the tunneling current and therefore the resistance of the tunneling junction. When a sense current is passed from the top electrode to the bottom electrode in a direction perpendicular to the MTJ layers, a lower resistance is detected when the magnetization directions of the free and pinned layers are in a parallel state ("1" memory state) and a higher resistance is noted when they are in an anti-parallel state or "0" memory state.

An alternative MRAM technology has been developed in the past several years and is called spin-transfer MRAM or STT-RAM. The spin-transfer effect arises from the spin dependent electron transport properties of ferromagnetic-spacer-ferromagnetic multilayers. When a spin-polarized current transverses a magnetic multilayer in a current perpendicular to plane (CPP) configuration, the spin angular moment of electrons incident on a ferromagnetic layer interacts with magnetic moments of the ferromagnetic layer near the interface between the ferromagnetic and non-magnetic spacer. Through this interaction, the electrons transfer a portion of their angular momentum to the ferromagnetic layer. As a result, spin-polarized current can switch the magnetization direction of the ferromagnetic (free) layer if the current density is sufficiently high, and if the dimensions of the multilayer are small. The difference between a SU-RAM and a conventional MRAM is only in the write operation mechanism. The read mechanism is the same.

A high performance MRAM MTJ element is characterized by a high tunneling magnetoresistive (TMR) ratio which is dR/R where R is the minimum resistance of the MTJ element and dR is the change in resistance observed by switching the magnetic state of the free layer. A high TMR ratio and resistance uniformity (Rp_cov), and a low switching field (Hc) and low magnetostriction ($\lambda_S$) value are desirable for conventional MRAM applications. For STT-RAM, a high $\lambda_S$ and high Hc leads to high anisotropy for greater thermal stability. This result is accomplished by (a) well controlled magnetization and switching of the free layer, (b) well controlled magnetization of a pinned layer that has a large exchange field and high thermal stability and, (c) integrity of the tunnel barrier layer. Other important MTJ properties in both MRAM and SU-RAM are a low bit-to-bit resistance variation, a low number of shorted bits, and a low bit-to-bit switching variation. Simultaneous optimization of all the aforementioned parameters is necessary for making high performance MRAM products.

Numerous MTJ designs have been proposed and fabricated in the prior art but there is still a need for improvement in all of the performance categories mentioned above. Typically, an improvement in one property leads to a degradation in one or more other parameters. For example, NiFe affords excellent switching properties but the TMR ratio with a MTJ having a NiFe free layer is lower than can be achieved with CoFe, CoFeB, or other free layer materials. Even a CoFeB/

NiFe free layer no longer exhibits a high TMR characteristic of MgO/CoFeB configurations because the NiFe layer with fcc (111) crystal structure prevents the adjacent CoFeB layer from crystallizing in the bcc (001) phase necessary for high spin polarization (and thus high TMR) at the MgO/CoFeB interface.

A MgO tunnel barrier when used in combination with CoFeB pinned and free layers is known to yield a high TMR ratio. However, CoFeB is known to have a relatively high magnetoresistance value which is a disadvantage. U.S. Pat. No. 7,750,421 discloses a MgO tunnel barrier and a Fe/CoFeB free layer thereon comprising a crystalline layer and an amorphous layer to decrease the damping constant in a STT-RAM while maintaining a high MR ratio.

In U.S. Pat. No. 7,666,467, a MTJ is described having a MgO tunnel barrier, a thin interface layer of crystalline CoFe, and an amorphous ferromagnetic layer to form a composite free layer.

U.S. Pat. No. 7,738,287 teaches that a ferromagnetic free or pinned layer with a crystalline property may be modified to have an amorphous character by including elements such as Zr, Hf, Nb, and Ta.

However, an improved MTJ is still required that improves bit line shorting and switching properties while maintaining a high TMR ratio and without compromising other important MTJ parameters.

SUMMARY OF THE INVENTION

One objective of the present invention is to provide an improved MTJ element that enhances the bit switching characteristic of a MRAM such that the number of unswitched bits at a given bit line current is reduced compared with the prior art.

A second objective of the present invention is to achieve the improved bit switching property of the first objective without degrading the MR ratio of the MTJ.

A third objective of the present invention is to simultaneously achieve a reduced number of shorted bits and enhanced bit switching property including a lower switching current without degrading the MR ratio of the MTJ.

According to a first embodiment, these objectives are achieved with a MTJ element comprised of at least a pinned layer/tunnel barrier layer/free layer configuration wherein a composite free layer adjoins a surface of the tunnel barrier layer which is preferably MgO. A key feature is the composite free layer that has a crystalline ferromagnetic layer adjoining the tunnel barrier layer and an amorphous layer contacting an opposing surface of the crystalline layer with respect to the MgO/crystalline layer interface. In particular, the crystalline layer preferably has a (001) bcc structure that leads to a high TMR ratio while the amorphous layer improves bit switching and bit shorting characteristics. For example, a Fe/NiFeHf composite free layer is especially suited to realize the objectives and advantages of the present invention. However, the NiFeHf layer should be in the range of 20 to 40 Angstroms thick to provide the full advantage of a reduced number of shorted bits and a substantially lower bit switching current. In an alternative embodiment, Hf may be replaced by X=Mg, Ta, Zr, or Nb. Preferably, the NiFeX layer has a sufficiently high X content to provide an amorphous structure.

In a second embodiment, the bilayer configuration of the composite free layer in the first embodiment is replaced by a trilayer with a Fe/NiFe/NiFeX composition wherein both of Fe and NiFe are crystalline layers and NiFeX is an amorphous layer in which X is Hf, Mg, Ta, Zr, or Nb. Alternatively, the amorphous layer may be made of more than one layer such as a bilayer configuration represented by $NiFeM_1/NiFeM_2$ where M1 and M2 are one of Hf, Mg, Ta, Zr, or Nb, and $M_1$ is unequal to $M_2$.

BRIEF DESCRIPTION OF THE DRAWINGS

FIG. 4a is a table that shows the number of shorted bits on a wafer comprised of a plurality of MTJ elements arranged in rows and columns and having a structure according to an embodiment of the present invention, and FIG. 4b is a similar table for a prior art MTJ structure.

DETAILED DESCRIPTION OF THE INVENTION

The present invention relates to magnetic tunnel junctions (MTJs) in MRAM devices including STT-RAM. Although a bottom spin valve structure is shown in the exemplary embodiments, the present invention also encompasses top spin valve and dual spin valve configurations that have a tunnel barrier sandwiched between a pinned layer and a free layer. A top surface of a layer is defined as a surface formed in an (x, y) plane and facing away from the substrate. The drawings are provided by way of example and are not intended to limit the scope of the invention. Moreover, the drawings are not necessarily drawn to scale and the relative sizes and shapes of various layers may differ from those in an actual device.

It should be understood that a MRAM structure is part of an MRAM array in which multiple parallel word lines are formed in a first conductive layer and multiple top conductor electrodes such as parallel bit lines are formed in a second conductive layer above an array of MTJs. Alternatively, the first conductive layer may be parallel bit lines while the second conductive layer is comprised of parallel word lines. The word lines and bit lines are aligned orthogonal to each other and a bottom conductor layer may be used to connect each MTJ element with a transistor in the substrate. An MTJ element is typically formed between a bottom conductor layer and bit line at each location where a bit line crosses over a word line. Only one MTJ is depicted in the exemplary embodiments in order to simplify the drawings and direct attention to the key feature of the present invention which is a composite free layer in a MTJ stack of layers having at least a pinned layer/tunnel barrier/free layer configuration.

Figure 1:
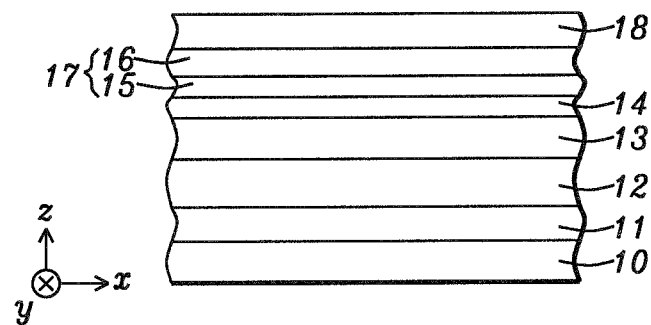
FIG. 1 is a cross-sectional view of a MTJ structure having a composite free layer formed according to a first embodiment of the present invention.

Referring to FIG. 1, a MTJ structure is illustrated according to a first embodiment of the present invention. The substrate 10 may be a bottom conductor layer, for example, having a thickness in the z-axis direction and with a top surface in the x,y plane. A MTJ stack of layers is now formed on the substrate 10. It should be understood that all layers in the MTJ stack may be formed in the same process tool such as an Anelva C-7100 thin film sputtering system or the like which typically includes three physical vapor deposition (PVD) chambers each having 5 targets, an oxidation chamber, and a sputter etching chamber. At least one of the PVD chambers is capable of co-sputtering. Typically, the sputter deposition process involves an argon sputter gas and the targets are made of metal or alloys to be deposited on a substrate. All MTJ layers may be formed after a single pump down of the sputter system to enhance throughput.

In the exemplary embodiment, the MTJ stack of layers is fabricated on the substrate 10 by sequentially forming a seed layer 11, AFM layer 12, synthetic anti-ferromagnetic (SyAF) pinned layer 13, tunnel barrier layer 14, composite free layer 17, and a cap layer 18. The seed layer 11 may be a layer of NiCr, NiFe, or NiFeCr, for example. In an embodiment wherein the seed layer is grown on a bottom conductor with an amorphous Ta capping layer, a smooth and dense (111) seed layer structure results that promotes smooth and densely packed growth in subsequently formed MTJ layers.

The AFM layer 12 is preferably made of MnPt although IrMn, NiMn, OsMn, RuMn, RhMn, PdMn, RuRhMn, or MnPtPd are also acceptable. The SyAF pinned layer 13 has an AP2/Ru/AP1 configuration wherein the AP2 layer is formed on the AFM layer 12 and is preferably comprised of CoFe although other ferromagnetic layers are acceptable. The magnetic moment of the AP2 layer is pinned in a direction anti-parallel to the magnetic moment of the AP1 layer. A slight difference in thickness between the AP2 and AP1 layers produces a small net magnetic moment for the SyAF pinned layer 13 in an in-plane direction. Exchange coupling between the AP2 layer and the AP1 layer is facilitated by a coupling layer that is preferably comprised of Ru with a thickness of about 7.5 Angstroms although Rh or Ir may be used instead of Ru. The AP1 layer on the coupling layer may be comprised of CoFe, CoFeB, or combinations thereof.

Above the SyAF pinned layer 13 is formed a thin tunnel barrier layer 14 which in the preferred embodiment is made of MgO although AlOx, TiOx, or other tunnel barrier materials used in the art are also acceptable. A MgO tunnel barrier may be formed by depositing a first Mg layer, oxidizing by a radical oxidation method (ROX) or natural oxidation (NOX) method, and then depositing a second Mg layer. After a subsequent annealing step, the tunnel barrier essentially becomes a uniform MgO layer.

A key feature of the present invention is the composite free layer 17 formed on the tunnel barrier 14. The composite free layer has a lower crystalline magnetic layer 15 contacting a top surface of the tunnel barrier layer and an upper amorphous layer 16 that may be either magnetic or non-magnetic. According to a first embodiment, the crystalline magnetic layer 15 is made of Fe, an alloy thereof such as $FeB_y$ where y is from 0 to about 5 atomic %, or Ni. The crystalline magnetic layer 15 has a (001) crystal orientation to match that of the MgO tunnel barrier layer 14 and thereby promote coherent tunneling which leads to a high TMR ratio. A small amount of B of up to about 5 atomic % may be added to Fe in order to lower Hc and improve thermal stability. Although the present invention also anticipates that CoFe may be used as the crystalline magnetic layer 15, the switching properties of a MTJ containing CoFe in the free layer are typically not as favorable as when CoFe is replaced by Fe.

Upper amorphous layer 16 is employed to improve one or more of switching performance and other MTJ characteristics without adversely affecting the TMR ratio or properties of the lower crystalline layer 15. Preferably, the upper amorphous layer 16 has a thickness from 20 to 40 Angstroms and is comprised of NiFeX where X is one of Hf, Zr, Nb, Ta, or Mg with a content of about 5 to 30 atomic %. Layer 16 is preferably amorphous rather than crystalline so that an upper free layer (if crystalline with a fcc structure) could not affect the crystal structure in the lower free layer where a (bcc) orientation is preferred for high MR ratio. We have previously disclosed in U.S. Pat. Nos. 7,528,457, 7,595,520, 7,663,131, and 7,672,093 how a NiFeX capping layer may be used with various tunnel barrier/free layer configurations to enhance the TMR ratio of a MTJ through an oxygen gettering effect. In U.S. Pat. No. 7,672,093, a NiFeHf capping layer is formed on a NiFe composite free layer comprised of two NiFe layers whose magnetostriction constants are of opposite sign. Now we have discovered that a composite free layer including an upper amorphous NiFeX layer offers additional benefits by reducing the number of shorted bits and lowering the bit switching current. Furthermore, the thickness of the crystalline magnetic layer 15 should be at least 6 Angstroms in order to maintain a high TMR ratio while the upper thickness limit of the Fe, Ni, or FeB crystalline layer depends on the Mst (magnetic saturation×thickness) requirement for the free layer. Note that the amorphous layer 16 generally contributes substantially less toward the Mst requirement for the composite free layer than the crystalline magnetic layer 15 because the magnetic moment of the former is reduced by the presence of the X element.

The minimum X content necessary to achieve an amorphous NiFeX film is about 5 atomic % for X. On the other hand, the X content should not be more than about 30 atomic %, especially for Ta or Nb, to prevent X from diffusing into the crystalline magnetic layer 15 and degrading the free layer properties. It should also be understood that the magnetostriction (λ) of the free layer 17 may be adjusted by changing the thicknesses of the layers 15, 16, and by modifying the X content in NiFeX. Although both Fe and NiFeX, for example, contribute a positive value to λ for free layer 17, Fe provides the larger component. As the % X in NiFeX increases, λ generally increases. Those skilled in the art will appreciate that NiFe may have either a (+) or (−) λ value, depending on the Ni content in the alloy. Likewise, a NiFeX alloy may have either a (+) or (−) λ value, depending on the Ni content and X content in the alloy. Typically, a λ less than about $1 \times 10^{-6}$ is desirable for the free layer 17.

The capping layer 18 formed on the free layer 17 may have a Ta or Ta/Ru composition although other capping layer materials may be used. The capping layer serves as an electrical contact with an overlying top electrode (bit line) and typically is employed as an etch stop and/or chemical mechanical polish (CMP) stop layer during subsequent processing steps. A Ta capping layer 18 serves as an oxygen getter layer to prevent oxygen from diffusing into the crystalline magnetic layer and lowering the TMR ratio, and is preferably an α-phase Ta layer with a low resistance.

Figure 2:
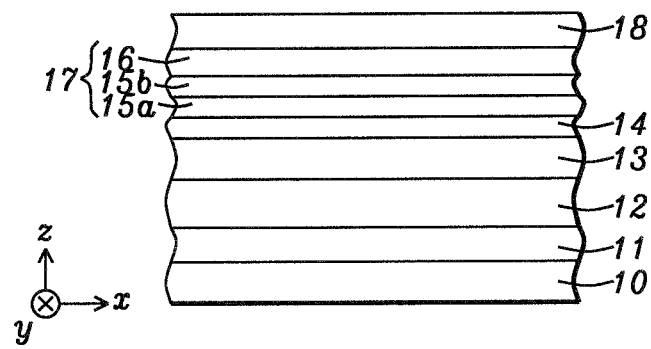
FIG. 2 is a cross-sectional view of the MTJ structure having a composite free layer formed according to a second embodiment of the present invention.

According to a second embodiment of the present invention as depicted in FIG. 2, the free layer 17 of the first embodiment may be modified to include two crystalline magnetic layers 15a, 15b. In particular, a lower crystalline layer 15a made of Fe, $FeB_y$, or Ni contacts tunnel barrier layer 14, and an upper crystalline layer 15b comprised of NiFe is formed between crystalline layer 15a and amorphous NiFeX layer 16. Note that unlike a CoFeB/NiFe configuration where NiFe prevents amorphous CoFeB from crystallizing into the desired (001) bcc structure, crystalline layer 15a is deposited with a (001) bcc structure and is unaffected by the nature of the NiFe crystal lattice. Furthermore, the addition of a Fe crystalline layer adjoining the tunnel barrier layer enhances the TMR ratio above that realized with a NiFe/NiFeHf free layer configuration. The relative thicknesses of the layers 15a, 15b, 16 may be adjusted to satisfy the Mst and λ, requirements of the free layer 17. However, crystalline layer 15a is preferably at least 6 Angstroms thick to provide a high TMR ratio approaching 150% or higher.

For improved flexibility in modifying the NiFeX composition, the NiFeX layer 16 in a MTJ stack is preferably deposited by co-sputtering NiFe and X targets. In one embodiment, the NiFe target and X target are placed at alternating positions in a sputter (PVD) chamber. For example, the NiFe target may be placed at position 2 in an Anelva C-7100 sputtering chamber while the X target is located at target position 4. Optionally, the NiFe target may be placed at position 1 and the X target at position 3. In one embodiment, the NiFe target has a Ni content of 80 atomic % and a Fe content of 20 atomic % although Ni/Fe ratios other than 4:1 may be employed.

It should be understood that the sputter deposition rate of a specific metal is dependent on the sputter power applied to the target cathode. Thus, the concentration of the NiFeX layer is controlled by the power applied simultaneously to the two respective targets. In the example where X is Mg, the Mg deposition rate is faster than the NiFe deposition rate using the same applied power. To compensate for the unequal deposition rates, a higher forward power is applied to the NiFe target than to the Mg target. The preferred deposition method comprises applying a forward power of 30 Watts (W) to 80 W, and more preferably 50 W, to the Mg target and a forward power of 100 W to 500 W, and more preferably 200 W, to the NiFe target to deposit a NiFeMg layer at a pressure less than about 0.3 mTorr and at an ambient temperature. The non-magnetic property, $B_S$ (magnetic moment), of the co-sputtered NiFeMg film is measured with a B-H looper. Composition of the non-magnetic NiFeMg alloy is analyzed with a well known EDS system using electron microscopy. The present invention also encompasses an embodiment in which a NiFeX target is sputtered to form a NiFeX layer in the MTJ stack in cases where X has a sufficiently low atomic % to allow a NiFeX target of sufficient size to be useful in a manufacturing scheme.

It is believed that one important mechanism responsible for achieving a high TMR ratio involves gettering oxygen from the crystalline magnetic layers 15a, 15b by the NiFeX layer 16. Thus, crystalline magnetic layers are less oxygen contaminated and have higher conductivity, thereby improving dR/R. Although the actual mechanism is not understood at this time, it is believed that the oxygen gettering power of a NiFeX layer may be at least partially responsible for an improved switching property and reduced bit shorts as described herein.

Figure 3:
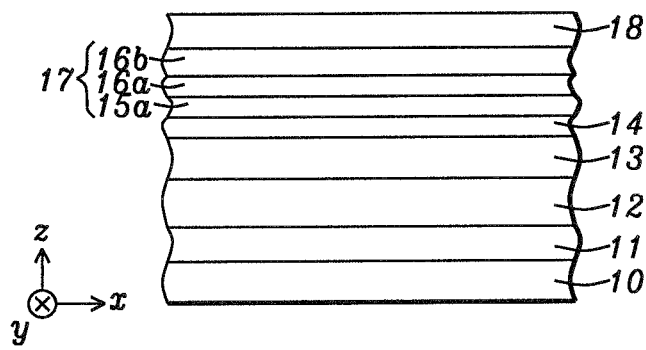
FIG. 3 is a cross-sectional view of the MTJ structure having a composite free layer formed according to a third embodiment of the present invention.

Referring to FIG. 3, a third embodiment of the present invention is illustrated and retains all of the features of the first embodiment except the amorphous layer is modified to include a bilayer configuration having a lower NiFeM$_1$ layer 16a contacting a top surface of the crystalline magnetic layer 15 (or NiFe layer 15b) and an upper NiFeM$_2$ layer interfacing with the capping layer 18 where M$_1$ and M$_2$ are Hf, Nb, Ta, Mg, or Zr, M$_1$ is unequal to M$_2$, and each of M$_1$ and M$_2$ is from 5 to 30 atomic %. This embodiment provides more flexibility to the amorphous layer design. For example, M$_1$=Hf may provide the maximum gettering power in a NiFeM$_1$ layer but another element such as Ta in NiFeM$_2$ may yield a better advantage in terms of etch resistance. In this embodiment, the combined thickness of amorphous layers 16a, 16b is preferably in the range of 20 to 40 Angstroms. When the crystalline magnetic layer is Fe or Fe/NiFe, the Fe layer preferably has a thickness of at least 6 Angstroms to provide a TMR value approaching 150% or higher.

The present invention also encompasses an annealing step after all of the MTJ layers have been deposited. For example, in the exemplary embodiment, the MTJ stack of layers is preferably annealed by applying a magnetic field of about 10K Oe in magnitude along the desired in-plane magnetization direction for about 1 to 2 hours at a temperature between 300° C. and 360° C., or less preferably for 5 hours at a temperature from 260° C. to 300° C. with a similar applied magnetic field.

After all of the MTJ layers have been deposited and annealing is completed, an MTJ element with sidewalls and a top surface having a circular, elliptical, or polygonal shape from a top view (not shown) as previously described in U.S. Pat. No. 7,595,520 which is herein incorporated by reference in its entirety may be fabricated by conventional photoresist patterning and etching techniques. Thereafter, the remainder of the MRAM structure is formed by well known methods including deposition of an interlevel dielectric layer (ILD) adjacent to the MTJ element and thereby electrically separating the MTJ from other MTJ elements in the MRAM array (not shown). Typically, a CMP step is performed to provide an ILD that is coplanar with the top surface of the MTJ. Then a metal layer (not shown) including bit lines, for example, is formed on the ILD and top surfaces of the MTJ elements in the MRAM array.

An experiment was conducted to determine the performance of a MTJ stack formed on a substrate according to the present invention. The MTJ stack has a seed layer/AFM layer/pinned layer/tunnel barrier/free layer/capping layer configuration represented by the following: NiCr45/MnPt150/Co$_{90}$Fe$_{10}$24/Ru/Co$_{60}$Fe$_{20}$B$_{20}$23/MgO13/free layer/Ta510 where the number following the composition of each layer is the thickness of that layer. The MgO layer was formed by depositing a first Mg layer, performing a radical oxidation (ROX) process, and then depositing a second Mg layer. Each MTJ stack was annealed with an in-plane magnetic field of 10000 Oe for 2 hours at 330° C. The results in Table 1 were obtained by using a Capres CIPT (current in plane tunneling) tool that measures dR/R on an unpatterned MTJ stack.

TABLE 1

TMR Ratio of MTJs with different free layer (FL) in
NiCr45/PtMn150/CoFe24/Ru7.5/CoFeB23/MgO13/FL/Ta510

| Example | Free layer configuration | dR/R |
| --- | --- | --- |
| Embodiment 1 | Fe(16.3)/NiFeHf(30) | 163% |
| Embodiment 2 | Fe(6)/NiFe(19)/NiFeHf(30) | 152% |
| Reference 1 | Fe(16.3A)/NiFeHf(10) | 157% |
| Reference 2 | Fe(25)/Al(10) | 91% |
| Reference 3 | NiFe(34)/NiFeHf(35) | 77% |

In all examples except reference 2, a Ni$_R$Fe$_S$Hf$_T$ layer where R=75, S=10, and T=15 was deposited by co-sputtering a Ni$_R$Fe$_S$ target and a Hf target in an Anelva 7100 sputter deposition system. With regard to the example representing embodiment 2, the NiFe layer has a Ni content of 88 atomic %. References 1-3 include free layer stacks previously built by the inventors for other experiments. TMR ratios for the examples representing embodiments 1 and 2 demonstrate that dR/R is as high as the value in other designs such as reference 1. One advantage of the present invention as found in the embodiments described herein is a dramatic reduction in the number of shorted bits in MRAM devices.

Referring to FIG. 4a and FIG. 4b, the MTJs of Embodiment 1 and Reference 1, respectively, above were incorporated in 4 Mb MRAM chips. The tables in FIG. 4a and FIG. 4b show the number of shorted bits per 0.5 Mb section of a 4 Mb chip, measured for multiple chips across an 8 inch wafer. Each number shown by column and row corresponds to one chip. Note that a thicker amorphous NiFeHf layer in the MTJ of Embodiment 1 results in an order of magnitude lower shorted bit number than having a thinner NiFeHf layer in the MTJ of Reference 1. We have discovered that a NiFeHf thickness of at least 20 to 25 Angstroms is required to provide a significant reduction in the shorted bit number. On the other hand, a NiFeHf thickness above 40 Angstroms is likely to lead to a lower TMR ratio.

Figure 5:
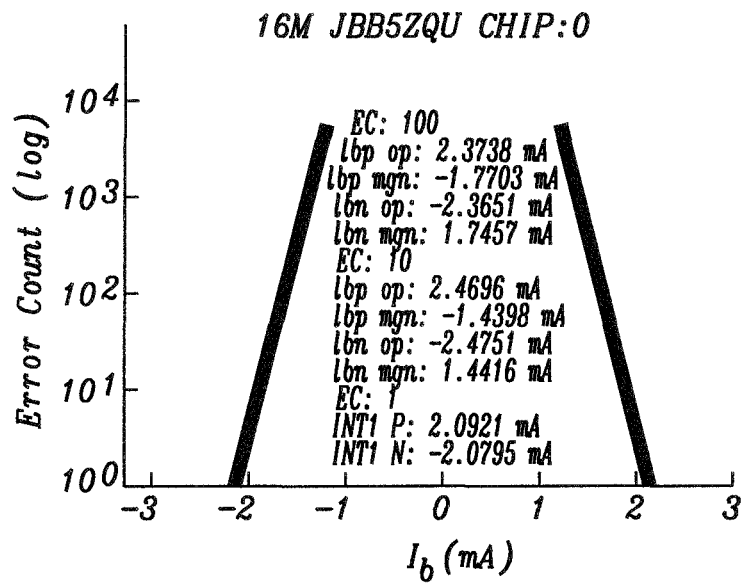
FIG. 5 is a plot showing the number of unswitched bits (error count) as a function of bit line current for a 4 Mb MRAM chip wherein each MTJ has a structure according to an embodiment of the present invention.
Figure 6:
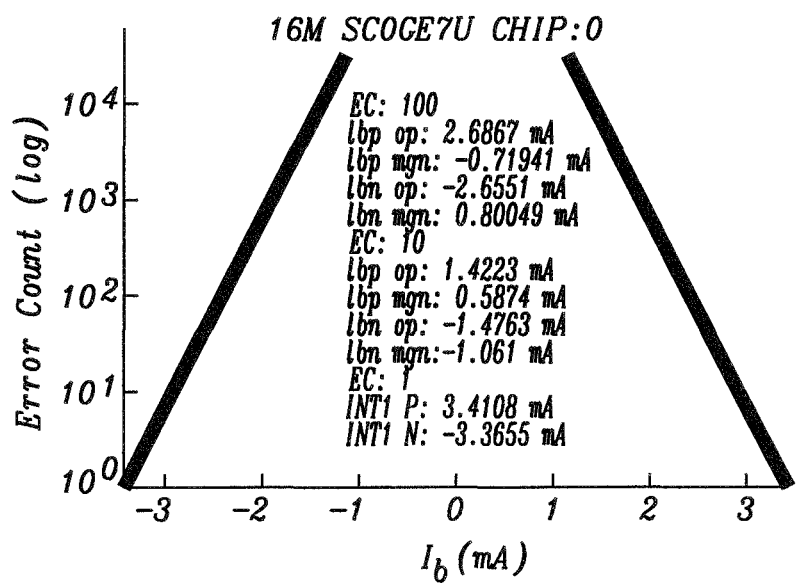
FIG. 6 is a plot showing the number of unswitched bits (error count) as a function of bit line current for a 4 Mb MRAM chip wherein each MTJ has a prior art structure similar to the one used to generate the plot in FIG. 4b.

Another important benefit of the present invention not realized in previous MTJ designs is a substantially improved bit switching characteristic expressed as the number of unswitched bits at a given bitline current value. In other words, lowering the number of unswitched bits (error count) is a key improvement. Referring to FIG. 5, error count is plotted as a function of current (mA) for the 4 Mb MRAM chip with MTJ structures of Embodiment 1. The actual data points in the plot have been replaced by two diagonal lines which represent the average slope of multiple lines (not shown). In FIG. 6, error count is plotted as a function of current for the 4 Mb MRAM chip having MTJ structures of Reference 1. Again, actual data points have been removed and replaced by two diagonal lines representing an average slope of multiple lines (not shown). Note that the x-intercept is about 2 mA (or −2 mA) in FIG. 5 and approximately 3.4 mA (or −3.4 mA) in FIG. 6 which means that a substantially lower bitline current is required to switch the bits for a MTJ structure of Embodiment 1. Thus, lower switching current translates into less power consumption, lower heating, and improved reliability in the MRAM device comprised of MTJs of the present invention.

In summary, the present invention provides a lower bitline switching current and a reduced number of shorted bits compared with prior designs while maintaining a high TMR ratio. Moreover, magnetostriction of about $1 \times 10^{-6}$ can achieved by adjusting the relative thicknesses of the crystalline magnetic layer and amorphous layer in the composite free layer, by modifying the Ni and X content in the NiFeX amorphous layer, or by including NiFe in the crystalline magnetic layer as described herein. The co-sputtering of NiFe and X targets allows flexibility in depositing an amorphous NiFeX layer with a range of X content.

While this invention has been particularly shown and described with reference to, the preferred embodiment thereof, it will be understood by those skilled in the art that various changes in form and details may be made without departing from the spirit and scope of this invention.

We claim:

1. A MTJ element in a magnetic device, comprising:
   (a) a synthetic anti-ferromagnetic (SyAF) pinned layer formed on a substrate;
   (b) a tunnel barrier layer on the SyAF pinned layer; and
   (c) a composite free layer on the tunnel barrier layer, comprising:
      (1) a crystalline magnetic layer contacting a top surface of the tunnel barrier layer; and
      (2) an amorphous bilayer contacting a top surface of the crystalline magnetic layer wherein said amorphous bilayer has a lower $NiFeM_1$ layer and an upper $NiFeM_2$ layer in which $M_1$ and $M_2$ are one of Hf, Zr, Nb, Ta, or Mg, and $M_1$ is unequal to $M_2$.

2. The MTJ element of claim 1 wherein the amorphous bilayer has a thickness between about 20 and 40 Angstroms.

3. The MTJ element of claim 1 wherein the crystalline magnetic layer is comprised of Fe, Ni, or $FeB_y$ where y is from 0 to about 5 atomic %.

4. The MTJ element of claim 1 wherein the crystalline magnetic layer has a Fe/NiFe configuration in which the Fe layer contacts the tunnel barrier layer, and the NiFe layer is formed between the Fe layer and the amorphous bilayer.

5. The MTJ element of claim 1 wherein each of the $NiFeM_1$ and $NiFeM_2$ layers has a composition wherein $M_1$ and $M_2$, respectively, have a content from about 5 to 30 atomic %.

6. The MTJ element of claim 3 wherein the crystalline magnetic layer is Fe and said Fe layer has a thickness of at least 6 Angstroms.

* * * * *